United States Patent [19]

Ackland et al.

[11] Patent Number: 5,739,562
[45] Date of Patent: Apr. 14, 1998

[54] COMBINED PHOTOGATE AND PHOTODIODE ACTIVE PIXEL IMAGE SENSOR

[75] Inventors: Bryan David Ackland, Old Bridge; Alexander George Dickinson, Neptune; David Andrew Inglis, Holmdel, all of N.J.

[73] Assignee: Lucent Technologies Inc., Murray Hill, N.J.

[21] Appl. No.: 509,930

[22] Filed: Aug. 1, 1995

[51] Int. Cl.[6] .................. H01L 31/062; H01L 31/113
[52] U.S. Cl. .................. 257/291; 257/292; 257/293; 257/440; 257/443; 257/462
[58] Field of Search .................. 257/290, 291, 257/292, 293, 239, 369, 440, 443, 462

[56] References Cited

U.S. PATENT DOCUMENTS 5,408,113  4/1995  Kanno et al. .................. 257/292
5,576,763  11/1996  Ackland et al. .................. 348/308

*Primary Examiner*—Ngân V. Ngô

[57] ABSTRACT

An active pixel image sensor includes an array of pixels arranged in a first group and a second group. The first group may constitute a row and the second group may constitute a column, for example. A first common conductor is coupled to the pixels in the first group for conducting control signals. A second common conductor is coupled to the pixels in the second group for selectively transmitting signals to processing electronics. Each of the pixels includes a plurality of sensing elements that are each configured for capturing a portion of energy from an object to be imaged. At least one of the sensing elements is of a type distinct from another of the sensing elements. For example, one of the sensing elements may be a photogate and another may be a photodiode. An amplifying arrangement is provided for receiving signals from selected ones of the plurality of sensing elements and for selectively providing output signals to the second common conductor.

28 Claims, 4 Drawing Sheets

COMBINED PHOTOGATE AND PHOTODIODE ACTIVE PIXEL IMAGE SENSOR

CROSS-REFERENCE TO RELATED APPLICATIONS

This application is related to co-pending application Ser. No. 08/344,785 entitled "Single Polysilicon CMOS Active Pixel", filed on Nov. 22, 1994, and co-pending application Ser. No. 08/321,350 entitled "An Active Pixel Image Sensor", filed on Jul. 8, 1994.

FIELD OF THE INVENTION

This invention relates generally to CMOS active pixels, and more particularly to an active pixel employing a plurality of sensing elements.

BACKGROUND OF THE INVENTION

Solid state image sensors are presently realized in a number of forms. Charge coupled devices and MOS diode arrays, for example, are both based on a two dimensional array of pixels. Each pixel includes a sensing element which is capable of converting a portion of an optical image into an electronic signal. In charge coupled devices the photocharges generated by each sensing element are transported by electronic shift registers to an output node at the perimeter of the array where an amplifier is typically located. In MOS diode arrays the electronic shift registers are replaced with common conductors interconnecting pixels located in respective rows and columns. Typically, each common conductor interconnecting a column of pixels transports charge to a distinct amplifier located at the perimeter of the array.

Another class of solid state image sensors is a CMOS active pixel array. In contrast to both charge coupled devices and MOS diode arrays, the individual active pixels in the array each include an amplifier for amplifying the electronic signal from the sensing element prior to transferring the signal to a common conductor, which in turn conducts the signal to an output node.

Active pixel arrays typically employ one of two distinct types of sensing elements known as photodiodes and photogates. An active pixel for converting color images often requires at least three sensing elements to capture the red, green, and blue portions of the spectrum. In known active pixels the three sensing elements are either all photodiodes or all photogates.

SUMMARY OF THE INVENTION

The present inventors have realized that an active pixel may be provided which incorporates a combination of both photogate sensing elements and photodiode sensing elements. Photodiode elements generally offer greater light sensitivity than photogate elements, particularly toward the blue portion of the visible spectrum, while photogate elements typically offer superior read-out noise performance. Accordingly, the overall performance of the active pixel may be enhanced by using a combination of sensing elements that utilizes the best characteristics of each type of sensing element. For example, in an active pixel employing three sensing elements to respectively capture the red, green and blue portions of the spectrum, a photodiode element may be advantageously employed to capture the blue spectrum while photogate elements may be employed to capture the red and green portions of the spectrum. This combination of sensing elements enhances the light sensitivity of the active pixel in the blue portion of the spectrum while reducing read-out noise. Of course, other sensing element combinations may be advantageously employed to suitably balance high sensitivity and reduced noise for any given imaging application.

In accordance with one embodiment of the invention, an active pixel image sensor includes an array of pixels arranged in a first group and a second group. The first group may constitute a row and the second group may constitute a column, for example. A first common conductor is coupled to the pixels in the first group for conducting control signals. A second common conductor is coupled to the pixels in the second group for selectively transmitting to output nodes electronic data signals corresponding to portions of the image being converted. Each of the pixels includes a plurality of sensing elements that are each configured for capturing a portion of energy from an object to be imaged. At least one of the sensing elements is of a type distinct from another of the sensing elements. For example, one of the sensing elements may be a photogate and another may be a photodiode. An amplifying arrangement is provided for selectively receiving signals from the plurality of sensing elements and for selectively providing output signals to the second common conductor.

Further features of the present invention will become more apparent from the following detailed description when read in conjunction with the accompanying drawings.

DETAILED DESCRIPTION OF THE INVENTION

Figure 1:
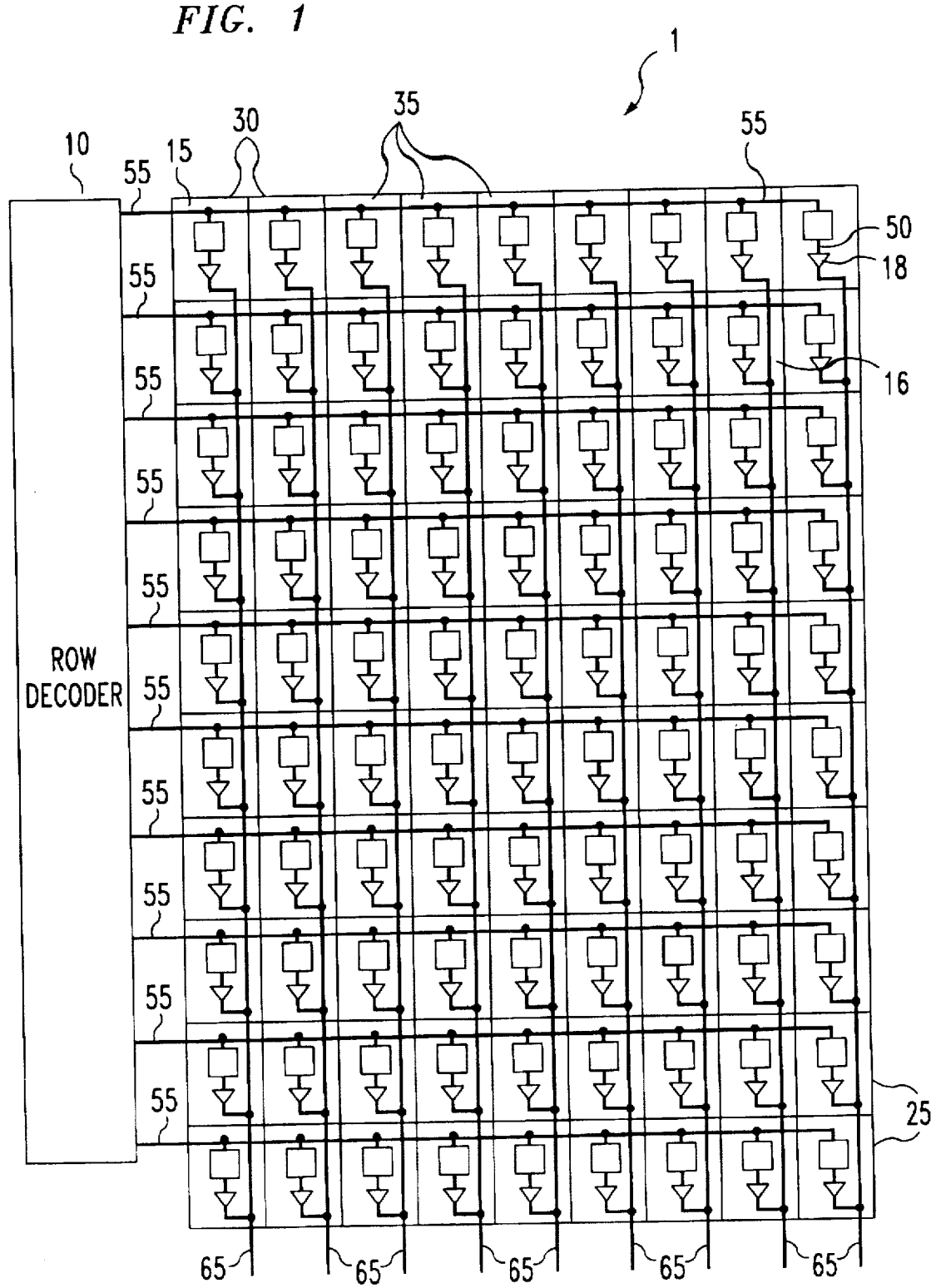
FIG. 1 is a schematic diagram of an exemplary active pixel image sensor in accordance with the present invention.

FIG. 1 shows an active pixel sensor imaging system 1 according to the present invention which includes an active pixel sensor array 5, a row decoder, 10, and a plurality of output amplifiers 18. The active pixel sensor array 5 includes a series of columns 30 and rows 25 of closely spaced active pixels 35. The individual active pixels 35 may be characterized as either a peripheral pixel, such as pixel 15 shown in FIG. 1, or alternatively, as an interior pixel such as pixel 16 shown in FIG. 1. The active pixel sensor array 5 is illustrated as a ten-by-ten sensor array for illustrative purposes only and is not meant to be a limitation on the present invention. An active pixel array in accordance with the present invention may consist of any number of rows and columns of active pixel sensors, and for many applications will typically consist of an array of a large number of pixels. Moreover, the pixels may be arranged in groups other than rows and columns.

Figure 2:
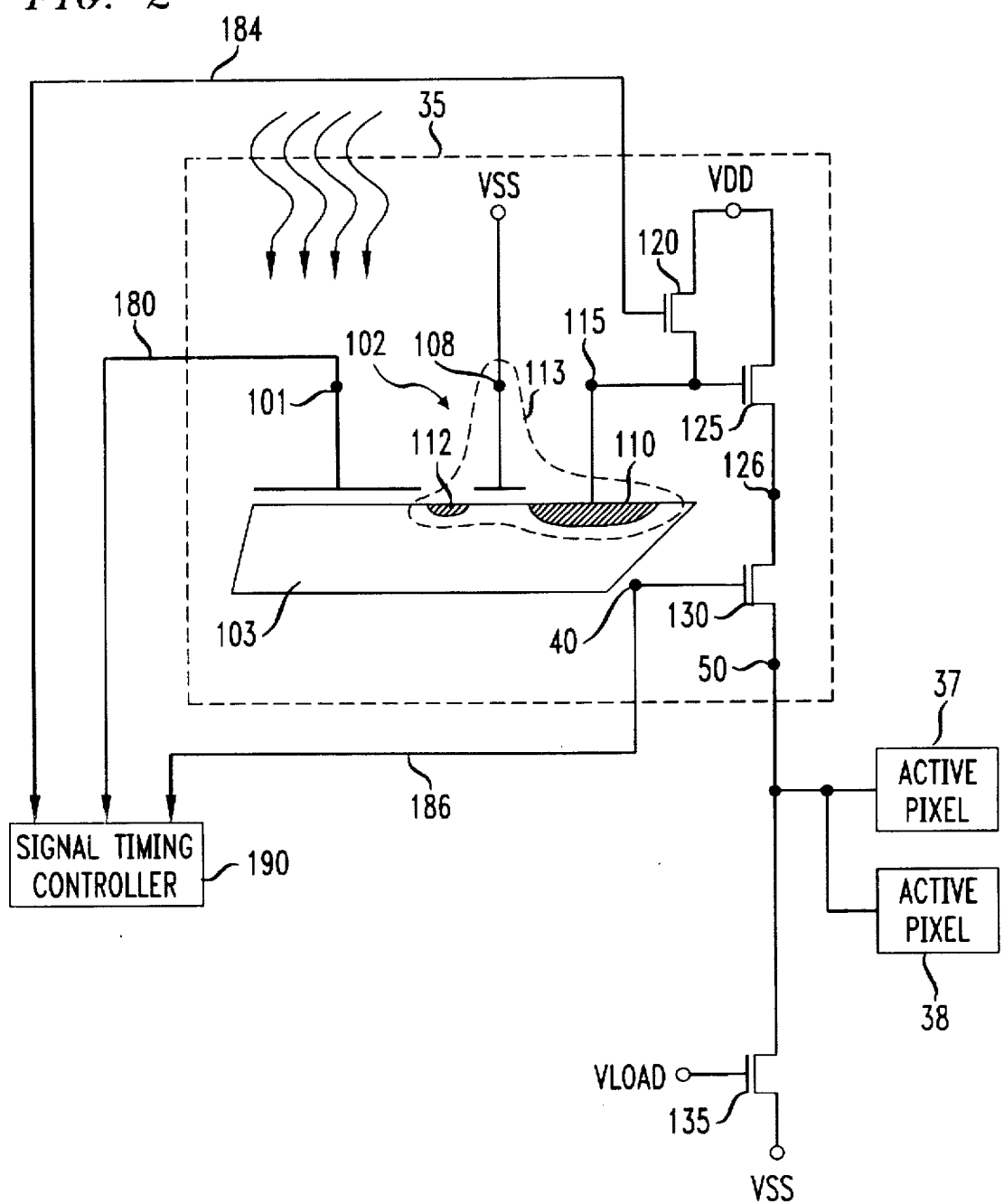
FIG. 2 is a schematic of a known photogate active pixel sensor.

Each active pixel 35 includes a sensing element that is capable of converting a detected quantity of light to a corresponding electrical signal at an output 50. The pixels in each row are connected to a common conductor 55 serving as a control line. FIG. 2 shows the control line including a reset control line 184, a select control line 186 and, if the sensing element employed is of the photogate type, a photogate control line 180. The reset control line, select control line, and the photogate control line 180 are shown in FIG. 2. The active pixel output 50 that generates the output signal is the connection point between the select and load transistors 130 and 135. The pixel output 50 is connected to the column output line 65.

Returning now to FIG. 1, it will be seen that each active pixel output 50 in a corresponding column 30 is connected by a common conductor 65 serving as a column output line to a particular amplifier 18. The detailed circuitry of the row decoder 10 and the amplifier 18 are well known to one ordinarily skilled in the art.

In operation, a timing controller (not shown) provides timing signals to the row decoder 10 which sequentially activates each row 25 of active pixels 35 via the control lines 55 to detect light intensity and to generate corresponding output voltage signals during each frame interval. A frame, as used herein, refers to a single complete cycle of activating and sensing the output from each pixel 35 in the array a single time over a predetermined frame time period. The timing of the imaging system is controlled to achieve a desired frame rate, such as 30 frames per second.

When detecting a particular frame, each row 25 may be activated to detect light intensity over a substantial portion of the frame interval. In the time remaining after the sensor row 25 has detected the light intensity for the frame, each of the respective pixels simultaneously generates output voltage signals corresponding to the amount of light selected by that pixel 35. If an image is focused on the array 5 by, for example, a conventional camera lens, then each pixel 35 generates an output voltage signal corresponding to the light intensity for a portion of the image focused on that pixel 35. The output voltage signals generated by the activated row 25 are simultaneously provided to the corresponding amplifiers 18 via the column output line 65.

A schematic and electron transfer diagram of an individual active pixel 35 is shown in FIG. 2. The active pixel 35 includes a sensing element 102 that may be either a photodiode or a photogate. In FIG. 2 the sensing element is a photogate. The active pixel 35 further includes a reset transistor 120, an amplifier formed by a voltage-follower transistor 125, and a select transistor 130. A load, such as a suitably biased load transistor 135 may be included as part of the pixel. The load transistor 135 may be common to other active pixels in the same column such as the pixels 37 and 38, for example. Of course, while two additional active pixels 37 and 38 are shown, it will be understood that many more pixels might be included such as shown in FIG. 1.

The photogate sensing element 102 shown in FIG. 2 includes a semiconductor substrate 103 over which is formed a photo gate 101 and a transfer gate 108 charge-coupled to the photogate 101. The semiconductor substrate 103 includes a diffusion region 110 and a coupling diffusion region 112 situated between the photo gate 101 and the transfer gate 108. The coupling diffusion region 112, the diffusion region 110 and the transfer gate 108 function collectively as a transistor 113, referred to as a transfer transistor. The coupling diffusion region 112 functions as the source and the diffusion region 110 functions as the drain of transfer transistor 113. One example of a photogate sensing element that may be employed in the present invention is disclosed in copending U.S. patent application Ser. No. 08/344,785. Photogate sensing elements having different configurations from that shown also may be employed.

A floating diffusion node 115 connects the diffusion region 110 of photogate sensing element 102 to the reset transistor 120 and the voltage-follower transistor 125. The reset 120 and voltage-follower transistors 125 are further connected to a fixed voltage VDD which may be, for example, five volts. The reset transistor 120 is also connected to the reset control line 184. The reset control line 184 constitutes part of the control line 55 shown in FIG. 1. The voltage-follower transistor 125 is further connected to the select transistor 130 which is electrically connected to the load transistor 135.

The load transistor 135 is also connected to a fixed load voltage VLOAD, and a fixed voltage VSS which may be, for example, zero volts. The select transistor 130 is further connected to the select control line 186 from the row decoder 10 (FIG. 1). The select control line 186 constitutes another part of the control line 55 (FIG. 1). The load voltage VLOAD should be adjusted such that a desired resistance is achieved across the load transistor 135 between the node 50 and the fixed voltage VSS. Accordingly, suitable alternatives for the load transistor 135 include a resistor or any other passive or active device that can provide the required electrical resistance when disposed between the node 50 and the fixed voltage VSS.

The active pixel may be either an n-channel device with electrons as the photo-generated charge carriers or a p-channel device with holes as the photo-generated charge carriers. For the balance of this description, the active pixel is assumed to be an n-channel device.

The row decoder 10 generates reset, select and photo gate control signals on lines 184, 186 and 180, causing the active pixel to operate in two phases, integration and read-out. In the integration phase, the generated charge carriers are collected under the photo gate 101 for a predetermined period, referred to as the integration time. The maximum integration time is dictated by the frame rate, or in other words, the number of times per second an image is updated, for the particular imaging application for which the active pixel is being used. For example, for commercial video applications, the frame rate is 30 frames per second. Thus, the maximum integration time is about 1/30 of a second. The charge carriers are collected by clocking the photo gate 101 to a relatively high voltage level, such as VDD. The transfer gate 108 is typically biased to a constant voltage during both integration and read-out.

In the read-out phase, the reset transistor 120 is reset by pulsing it on and off. This pulsing causes the potential of the diffusion node 115 to float at a level approximately equal to VDD less the threshold voltage. Next, the bias of the photo gate 101 is changed to approximately VSS, causing charge transfer to the diffusion node 115. Charge transfer causes the potential of the diffusion node 115 to deviate from its value, approximately VDD, or in other words, the reset level, to another value which is dictated by the photo-generated charge. This other value is the signal level. The difference between the reset and signal levels is proportional to the incident light intensity and constitutes a video signal. The voltage-follower transistor 125 amplifies the video signal by an amount sufficient to overcome the relatively large load offered by the common output conductor 65. The amount of amplification should be sufficient to provide a voltage at the amplifier 18 that is suitable for subsequent processing. The voltage-follower transistor 125 along with the load transistor 135 also serves to buffer the diffusion node 115 from the output 50 of the active pixel sensor 35.

The select transistor 130 is used as a switch to select the pixel for read-out. While in FIG. 2 the select transistor 130 receives an amplified signal from the voltage-follower transistor 125 and selectively provides this signal to the common output conductor 65, other amplifier arrangements also may be employed. For example, an arrangement may be used in which the switching and amplifying functions occur in the opposite order from that discussed above. That is, a switch may selectively transmit to the amplifier the signal from the diffusion node. The amplifier in turn may provide the amplified signal to the common conductor 65. In addition, the amplifying arrangement may use CMOS technology.

The above-described operation of the photogate active pixel 35 permits the correlated double sampling (CDS) technique to be applied. In accordance with this known technique, since the diffusion node 115 is reset at the end of the integration period and immediately prior to transferring the charge carriers into the diffusion node 115 for read-out, thermal noise in the reset voltage level (VDD-Vth) and the signal voltage level (VDD-charge transfer) are correlated. The video signal, represented by the difference between the reset voltage level and the signal voltage level, is thus essentially free of thermal noise, which is also known as reset or kTC noise. The video signal is also free of fixed pattern noise (FPN) due to pixel transistor offsets.

Figure 3:
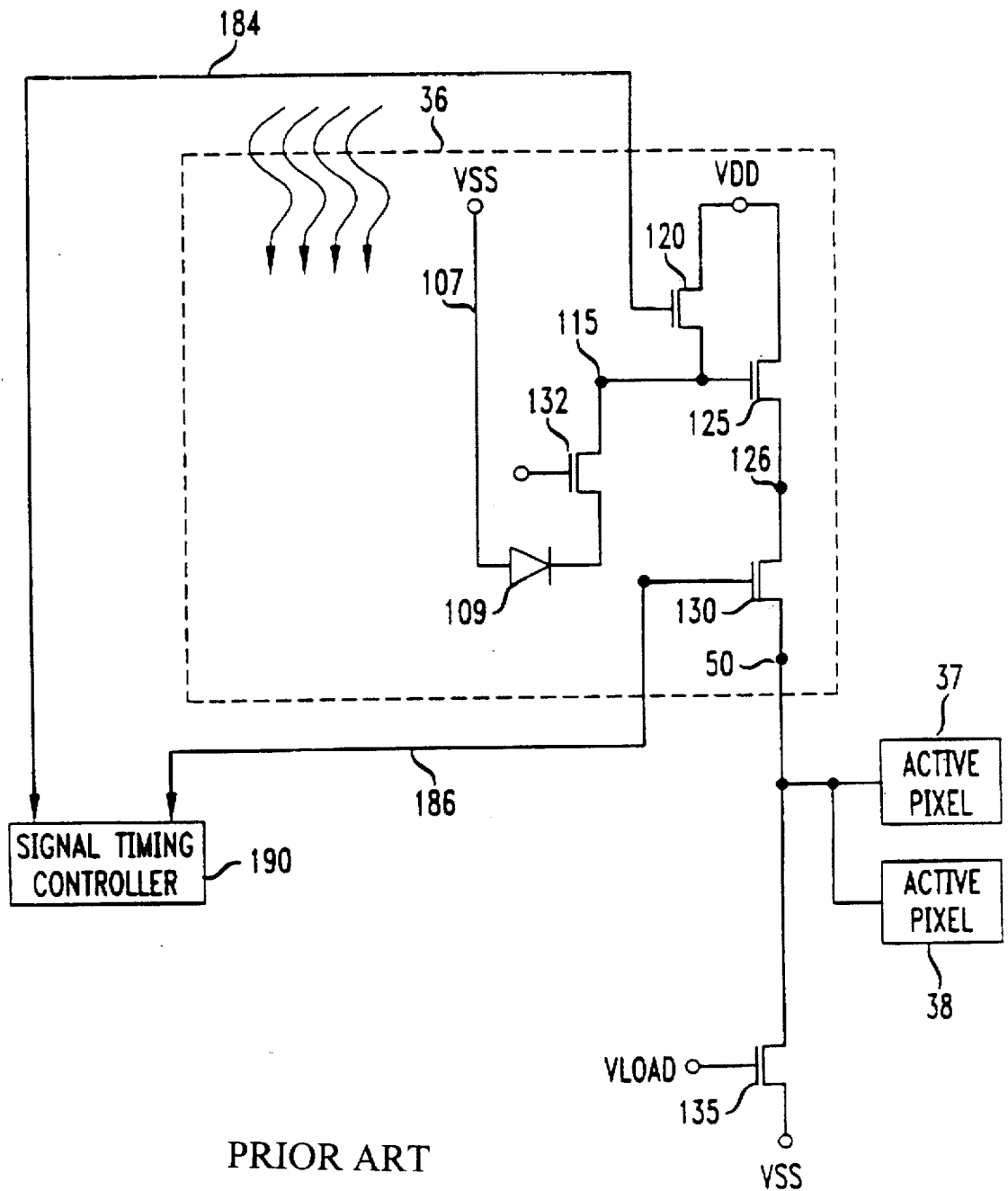
FIG. 3 is a schematic of a known photodiode active pixel sensor.

FIG. 3 shows a schematic diagram of an individual active pixel 36 in which the sensing element is a photodiode 109 rather than a photogate. The active pixels shown in FIGS. 2 and 3 may employ substantially the same circuitry and accordingly in FIGS. 2 and 3 like reference numerals refer to like elements. Since the photodiode active pixel 36 does not employ a photogate, there is no need for a control line 180 as shown in FIG. 2. A biasing line 107 is provided for applying the appropriate voltage to the photodiode 109. A transistor 132 serving as a transfer gate may optionally connect the node 115 to the photodiode 109.

The photodiode active pixel 36 operates in an integration and readout phase similar to the integration and readout phases previously described for the photogate active pixel 35. However, the integration phase for the photodiode active pixel 36 begins by pulsing the reset transistor 120 on and off to reset the photodiode element 109. Resetting causes the potential of the diffusion node 115 to float at a reset level approximately equal to VDD less the threshold voltage. The photodiode element 109 inherently includes capacitance to store an amount of charge proportional to the light intensity reflected from the object. The photogenerated charge carriers cause the potential of the diffusion node 115 to decrease from its value of approximately VDD to another value, the signal value, which is dictated by the photogenerated charge. The difference between the reset and signal levels is proportional to the incident light and constitutes the video signal. Just as for the photogate active pixel 35 shown in FIG. 2, the diffusion node 115 is buffered from the output node 50 by a source follower comprising a voltage-follower transistor 125 serving as an amplifier and the load transistor 135. The select transistor 130 is used to select the pixel for read-out.

As the preceding discussion makes clear, the operation of the photogate active pixel 35 is distinguished from the operation of the photodiode active pixel 36 in that for the photogate active pixel 35 the diffusion node 115 is reset at the end of the integration phase and just before the readout phase so that the reset voltage level and the signal voltage level are correlated. However since for the photodiode active pixel 36 the diffusion node 115 is reset at the beginning of the integration period, the reset and signal voltage levels are separated in time by a full integration period, which for video imaging is approximately 30 ms, and thus the reset voltage level and the signal voltage level are not correlated.

Accordingly, the correlated double sampling technique cannot be applied to the photodiode active pixel 36 and consequently the noise performance of the photodiode active pixel 36 is inferior to the noise performance of the photogate active pixel 35.

While the noise performance of the photodiode active pixel 36 is inferior to that of the photogate active pixel 35, the light sensitivity of the photodiode active pixel 36 is superior to that of photogate active pixel 35, particularly in the blue region of the visible spectrum. This disparity in sensitivity arises because the photosite of the photogate sensing element is covered by a polysilicon gate such as photogate 101 in FIG. 2, and thus some of the photons incident upon the pixel are absorbed by the polysilicon prior to reaching the photosite in the semiconducting material. Photons of shorter wavelength are absorbed more readily than photons of longer wavelength and hence blue light is preferentially absorbed. In contrast, since the photodiode element 109 does not include a gate its photosite is not covered by polysilicon, minimizing absorption prior to the creation of charge carriers.

An active pixel for a color camera typically requires at least three sensing elements to capture the red, green and blue color spectrums. Each sensing element is covered by a color filter layer, for example, a red, green or blue filter, so that the sensing element only receives the spectrum transmitted by the filter. In a conventional active pixel, the three sensing elements are either all photogate elements of all photodiode elements. The three sensing elements typically all share a common set of gating transistors such as those shown in FIGS. 2 and 3, for example, which define the reset and output electronics, to actuate the elements and amplify the outputs.

In accordance with the present invention, each active pixel is provided with a combination of both photogate and photodiode sensing elements. The combination of sensing elements may be selected to enhance the overall performance of the active pixel. For example, since the blue sensitivity of a photodiode element is superior to the blue sensitivity of a photogate element, each active pixel may advantageously employ a photodiode sensing element to capture the blue portion of the spectrum. On the other hand, since the read-out noise performance of the photogate sensing element is superior to the read-out noise performance of the photodiode sensing element, photogate sensing elements may be advantageously employed to capture the red and green portions of the spectrum.

Figure 4:
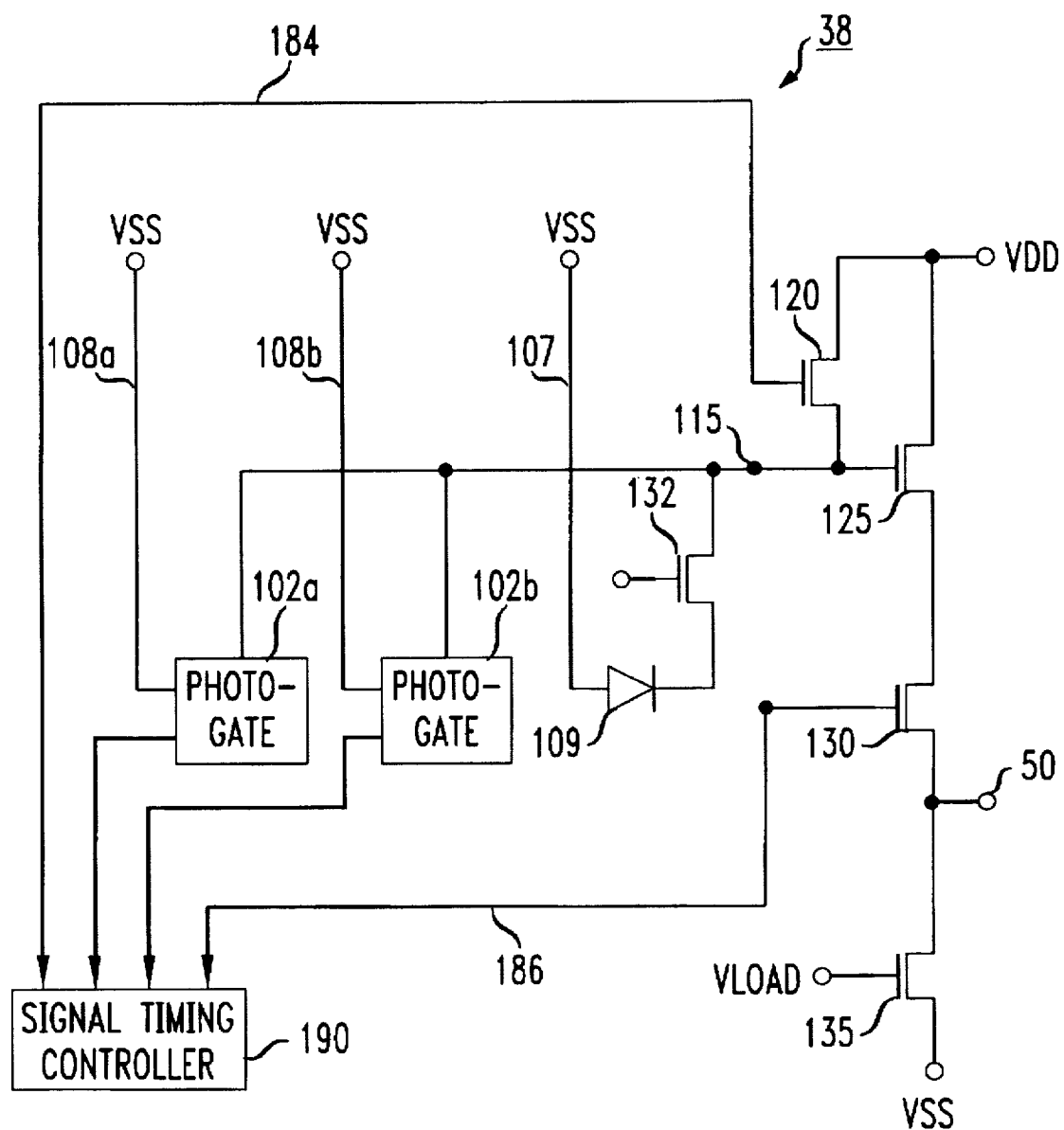
FIG. 4 is a schematic of an active pixel sensor employing both a photodiode and a photogate in accordance with the present invention.

FIG. 4 shows an exemplary active pixel 38 in accordance with the present invention that includes two photogate sensing elements 102a and 102b and one photodiode sensing element 109. In FIGS. 1, 2, 3, and 4 like reference numerals refer to like elements. The operation of the active pixel 38 is similar to the operation of the active pixels 35 and 36 described above. In one particular mode of operation, the sensing elements 102a, 102b, and 109 are sequentially read-out beginning with the photodiode 102c. More particularly, the integration phase begins by pulsing the reset transistor 120 on and off and applying a fixed voltage VSS to the photodiode 109 via biasing line 107. During the integration phase the photogenerated charge carriers in photodiode 109 cause the potential of the diffusion node 115 to decrease from its reset value to the signal value. The difference between the reset and signal values constitutes the video signal from the photodiode 109. Read-out of the photodiode 109 is accomplished in the same manner set forth above in connection with FIGS. 2 and 3. Charge carriers are also generated in the photogates 102a and 102b during the integration phase. After reading-out the photodiode 109, the reset transistor 120 is again pulsed on and off so that the diffusion node 115 returns to its reset value. The photogate 102a and the transfer transistor gate 108a are biased to a high voltage to initiate charge transfer from the photogate 102a. Charge transfer and read-out from the photogate 102a occurs in the manner previously described in connection with FIGS. 2 and 3. Finally, after the photogate 102a has been read-out the diffusion node 115 is returned to its reset value so that the photogate 102b may be read out. The order in which the photogates 102a and 102b are read-out may be reversed from what has been just described.

The inventive active pixel can be extended to arrangements other than those employing red, green and blue filters. In general, when light sensitivity is of primary concern, a photodiode sensing element may be employed. When read-out noise performance is of primary concern, a photogate sensing element may be employed. Accordingly, it will be readily apparent to one ordinarily skilled in the art that the present invention is applicable to any active pixel having multiple sensing elements for capturing energy from an object to be imaged.

We claim:

1. An active pixel image sensor comprising:
   an array of pixels;
   a first common conductor coupled to the pixels conducting control signals;
   a second common conductor coupled to the pixels for selectively transmitting signals to processing electronics;
   each of said pixels including:
      a plurality of sensing elements, each configured for capturing a portion of a spectrum from an object to be imaged, at least one of said sensing elements being of a different type than another of said sensing elements;
      an amplifying arrangement for selectively receiving signals from the plurality of sensing elements and selectively providing output signals to the second common conductor.

2. The sensor of claim 1 wherein at least one of said sensing elements is a photodiode sensing element and another of said sensing elements is a photogate sensing element.

3. The sensor of claim 2 wherein said photodiode sensing element is configured for capturing a first portion of the spectrum and said photogate sensing element is configured for capturing a second portion of the spectrum different from said first portion of energy.

4. The sensor of claim 3 wherein said first portion of the spectrum substantially corresponds to blue light.

5. The sensor of claim 3 further comprising a second photogate sensing element.

6. The sensor of claim 4 further comprising a second photogate sensing element.

7. The sensor of claim 1 wherein said plurality of sensing elements comprises first, second and third sensing elements respectively configured for capturing portions of the spectrum corresponding to red, green and blue light, said third sensing element being a photodiode sensing element.

8. The sensor of claim 1 wherein the active pixel has an N-channel configuration.

9. The sensor of claim 1 wherein the amplifying arrangement comprises a voltage follower transistor electrically connected to a select transistor, wherein the voltage follower transistor is electrically coupled to the plurality of sensing elements.

10. The sensor of claim 9 further comprising a reset transistor electrically coupled to the plurality of sensing elements and the first common conductor.

11. The sensor of claim 10 further comprising a load transistor coupled to said voltage follower transistor in a source follower configuration.

12. The sensor of claim 1 wherein said amplifying arrangement uses MOS technology.

13. The sensor of claim 9 wherein said amplifying arrangement uses MOS technology.

14. The sensor of claim 1 where the first common conductor is coupled to the pixels of a row, and the second common conductor is coupled to the pixels of a column.

15. The sensor of claim 3 wherein the first common conductor is coupled to the pixels of a row, and the second common conductor is coupled to the pixels of a column.

16. The sensor of claim 14 further comprising a plurality of rows and columns each having a plurality of pixels.

17. The sensor of claim 15 further comprising a plurality of rows and columns each having a plurality of pixels.

18. The sensor of claim 1 wherein said amplifying arrangement comprises an amplifier and a switch for selectively transmitting the output signal from the amplifier to the second common conductor.

19. The sensor of claim 15 wherein said amplifying arrangement comprises an amplifier and a switch for selectively transmitting the output signal from the amplifier to the second common conductor.

20. An active pixel image sensor comprising:
    a plurality of pixels each for converting a portion of an image to an electronic signal, said plurality of pixels including peripheral pixels and interior pixels, each of said pixels including;
       a plurality of sensing elements, each configured for capturing a portion of a spectrum from an object to be imaged, at least one of said sensing elements being of a type different than another of said sensing elements; and
       an amplifying arrangement for receiving signals from selected ones of said at least one sensing element and for providing output signals.

21. The sensor of claim 20 wherein at least one of said sensing elements is a photodiode sensing element and another of said sensing elements is a photogate sensing element.

22. The sensor of claim 21 wherein said photodiode sensing element is configured for capturing a first portion of the spectrum and said photogate sensing element is configured for capturing a second portion of the spectrum different from said first portion of the spectrum.

23. The sensor of claim 22 wherein said first portion of the spectrum substantially corresponds to blue light.

24. The sensor of claim 22 further comprising a second photogate sensing element.

25. The sensor of claim 23 further comprising a second photogate sensing element.

26. The sensor of claim 20 wherein said plurality of sensing elements comprises first, second and third sensing elements respectively configured for capturing portions of the spectrum corresponding to red, green and blue light, said third sensing element being a photodiode sensing element.

27. The sensor of claim 20 wherein the active pixel has an N-channel configuration.

28. The sensor of claim 20 wherein the amplifying arrangement comprises a voltage follower transistor electrically connected to a select transistor, wherein the voltage follower transistor is electrically coupled to the plurality of sensing elements.

* * * * *